United States Patent [19]

Bergemont

[11] Patent Number: 5,721,170

[45] Date of Patent: Feb. 24, 1998

[54] METHOD OF MAKING A HIGH-VOLTAGE MOS TRANSISTOR WITH INCREASED BREAKDOWN VOLTAGE

[75] Inventor: Albert M. Bergemont, Santa Clara, Calif.

[73] Assignee: National Semiconductor Corporation, Santa Clara, Calif.

[21] Appl. No.: 484,354

[22] Filed: Jun. 7, 1995

Related U.S. Application Data

[62] Division of Ser. No. 288,993, Aug. 11, 1994, abandoned.

[51] Int. Cl.$^6$ .................................................. H01L 21/336
[52] U.S. Cl. ........................................................... 438/303
[58] Field of Search ............................... 437/44, 40, 41

[56] References Cited

U.S. PATENT DOCUMENTS

| | | | |
|---|---|---|---|
| 4,949,136 | 8/1990 | Jain | 357/23.3 |
| 5,061,649 | 10/1991 | Takenouchi et al. | 437/44 |
| 5,162,884 | 11/1992 | Liou et al. | 437/41 GS |
| 5,254,866 | 10/1993 | Ogoh | 257/369 |
| 5,334,870 | 8/1994 | Katada et al. | 257/371 |
| 5,350,698 | 9/1994 | Huang et al. | 437/41 GS |
| 5,476,803 | 12/1995 | Liu | 437/21 SW |
| 5,518,944 | 5/1996 | Hiroki et al. | 437/41 SW |
| 5,518,945 | 5/1996 | Bracchitta et al. | 437/44 |
| 5,541,131 | 7/1996 | Yoo et al. | 437/41 GS |

FOREIGN PATENT DOCUMENTS

| | | | |
|---|---|---|---|
| 41 12 072 | 10/1991 | Germany. | |
| 56-045076 | 4/1981 | Japan. | |
| 56-056674 | 5/1981 | Japan. | |
| 56-162873 | 12/1981 | Japan | H01L 29/78 |
| 62-049664 | 8/1987 | Japan. | |
| 63-217665 | 9/1988 | Japan. | |
| 1-179363 | 7/1989 | Japan | H01L 29/78 |
| 4-288840 | 10/1992 | Japan | H01L 21/336 |
| 90 06594 | 6/1990 | WIPO. | |

OTHER PUBLICATIONS

A.L. Butler, et al., "Improved Device Performance as a result of Shallow Phosphorous Source–Drains by Rapid Thermal Annealing," Proceedings of the First International Symposium on Ultra Large Scale Integration Science and Technology, ULSI Science and Technology/1987, pp. vii–xi and 624–631.

M. Chen, "CMOS Hot Carrier Protection with LDD," Semiconductor Internatonal, Apr. 1988, pp. 1, 5, 6 and 78–81.

H. Mikoshiba, et al., "Comparison of Drain Structures in n–Channel MOSFET's," IEEE Transactions on Electron Devices, vol. ED-33, No.1, Jan. 1986, pp. 140–144.

*Primary Examiner*—Charles L. Bowers, Jr.
*Assistant Examiner*—Lynne A. Gurley
*Attorney, Agent, or Firm*—Limbach & Limbach L.L.P.

[57] ABSTRACT

In a high-voltage MOS transistor that utilizes a lightly-doped drain region to isolate a heavily-doped drain region from the substrate, the reverse bias which can be applied across the drain-to-substrate junction of the transistor is increased by reducing the width of the heavily-doped drain region.

10 Claims, 4 Drawing Sheets

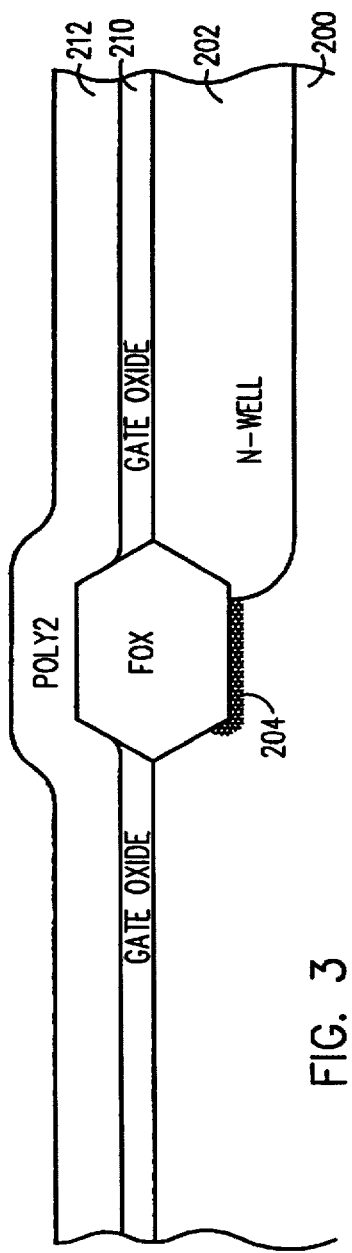
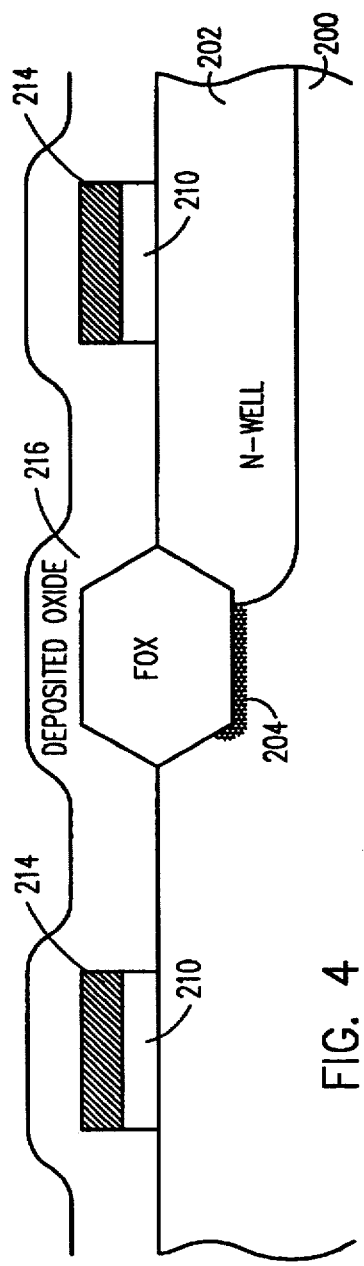
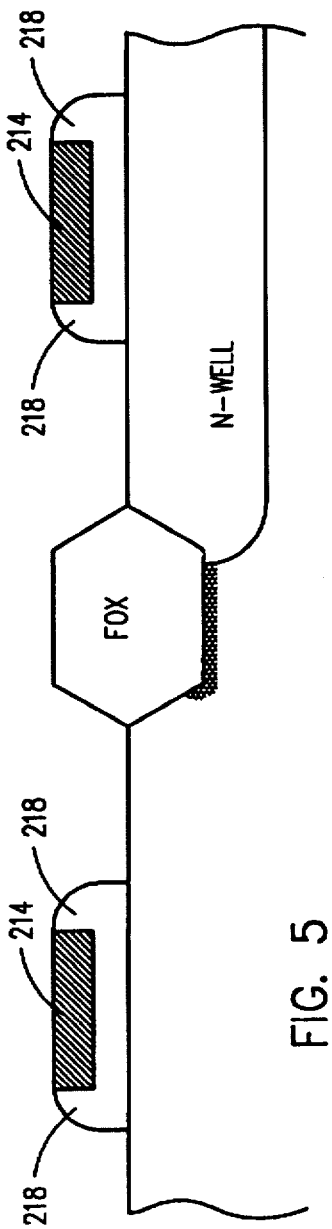
FIG. 3
FIG. 4
FIG. 5

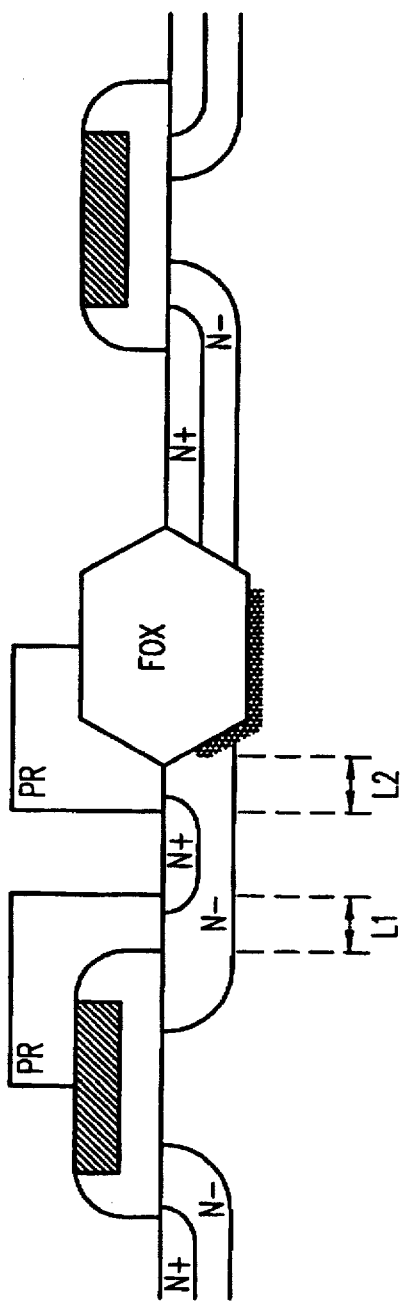
FIG. 8
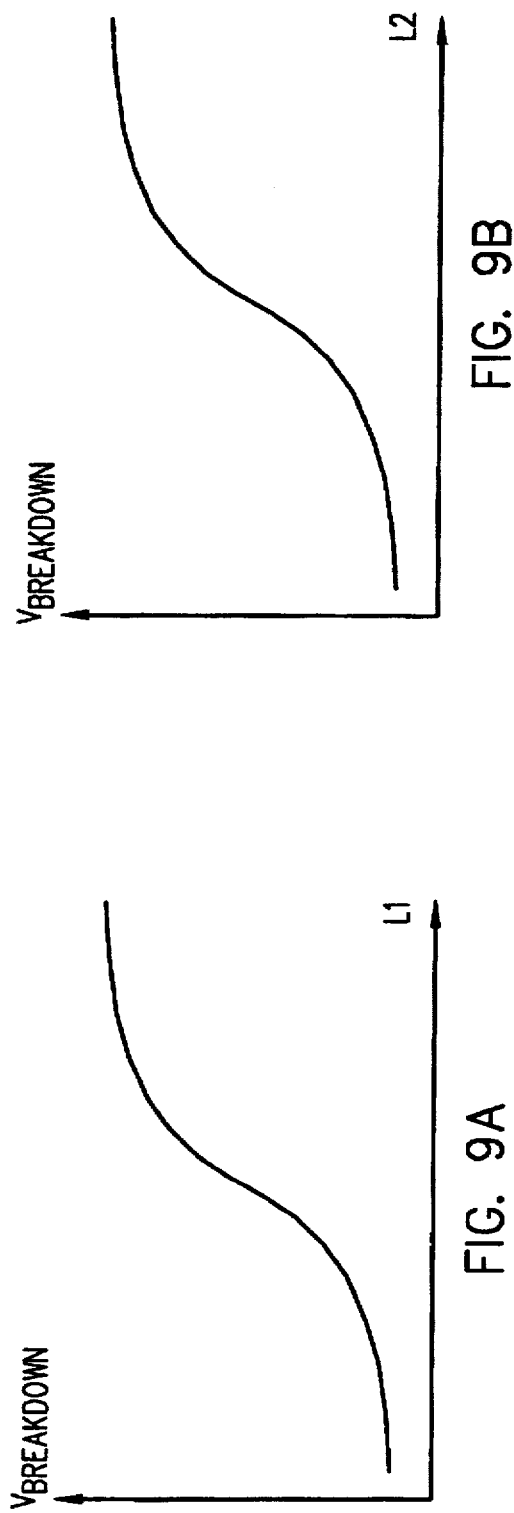
FIG. 9A
FIG. 9B

METHOD OF MAKING A HIGH-VOLTAGE MOS TRANSISTOR WITH INCREASED BREAKDOWN VOLTAGE

This is a divisional of application Ser. No. 08/288,993, filed Aug. 11, 1994 now abandoned.

BACKGROUND OF THE INVENTION

1. Field of the Invention

The present invention relates to high-voltage MOS transistors and, more particularly, to a high-voltage MOS transistor with an increased breakdown voltage.

2. Discussion of the Related Art

In a conventional MOS transistor, avalanche breakdown occurs when the reverse bias across the drain-to-substrate junction is increased to the point where carriers are accelerated by the electric field at the junction into ionizing collisions with the substrate lattice. These collisions create electron-hole pairs which are swept across the junction by the electric field. The movement of the electron-hole pairs, in turn, significantly increases the current flowing from the drain to the substrate.

The magnitude of the reverse bias which is required to induce an avalanche breakdown, however, can be greatly increased by reducing the doping concentration at the drain-to-substrate boundary. As a result, conventional high-voltage MOS transistors often utilize a lightly-doped-drain (LDD) to reduce the doping concentration.

FIG. 1 shows a cross-sectional diagram that illustrates a conventional high-voltage NMOS transistor 10. As shown in FIG. 1, both the drain region 12 and the source region 14 are formed by utilizing a lightly-doped drain region N– to isolate a heavily-doped drain region N+ from the substrate boundary. This graded N+/N– structure reduces the intensity of the electric field at the drain-to-substrate junction, thereby allowing a substantially larger reverse bias to be applied across the junction without inducing avalanche breakdown.

Although the lightly-doped drain region shown in FIG. 1 allows larger reverse biases to be applied across the drain-to-substrate junction, further increases are desirable.

SUMMARY OF THE INVENTION

In a high-voltage MOS transistor, a lightly-doped drain region is frequently utilized to isolate a heavily-doped drain region from the substrate. This isolation reduces the doping concentration at the drain-to-substrate junction which, in turn, reduces the intensity of the electric field at the junction. As a result, a substantially large reverse-bias can be applied across the junction without inducing an avalanche breakdown than can be applied across an abrupt junction. In the present invention, an even larger reverse-bias can be applied across the junction by reducing the size of the heavily-doped region.

A high-voltage transistor in accordance with the present invention includes a lightly-doped substrate, which has a first conductivity type, a layer of insulating material, which is formed over a portion of the substrate, and a gate, which is formed over the layer of insulating material. In addition, a layer of spacer material is formed over the substrate, and on the sidewalls of the gate and the layer of insulating material.

The transistor of the present invention also includes a source region and a drain region which are formed a distance apart in the substrate on opposite sides of the gate. The drain region includes a lightly-doped region of a second conductivity type and a heavily-doped region, also of the second conductivity type, which is formed within the lightly-doped region. The lightly-doped region is formed within the substrate so that a portion of the lightly-doped region is formed under the layer of spacer material. In accordance with the present invention, the heavily-doped region is formed in a region of the substrate which is uncovered by the layer of spacer material.

A better understanding of the features and advantages of the present invention will be obtained by reference to the following detailed description and accompanying drawings which set forth an illustrative embodiment in which the principles of the invention are utilized.

BRIEF DESCRIPTION OF THE DRAWINGS

FIGS. 3–7 are cross-sectional views illustrating the steps for forming both a high-voltage NMOS transistor and a high-voltage PMOS transistor in accordance with the present invention.

FIG. 8 is a cross-sectional diagram illustrating the formation of a high-voltage n-channel transistor next to a low-voltage n-channel transistor.

FIGS. 9A and 9B are graphs illustrating the increased breakdown voltage which can be achieved with the present invention.

DETAILED DESCRIPTION

Figure 1:
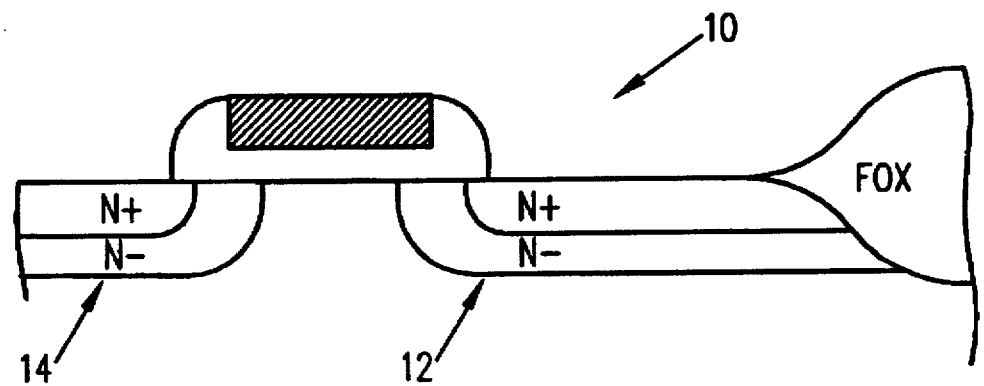
FIG. 1 is a cross-sectional diagram illustrating a conventional high-voltage NMOS transistor 10.
Figure 2:
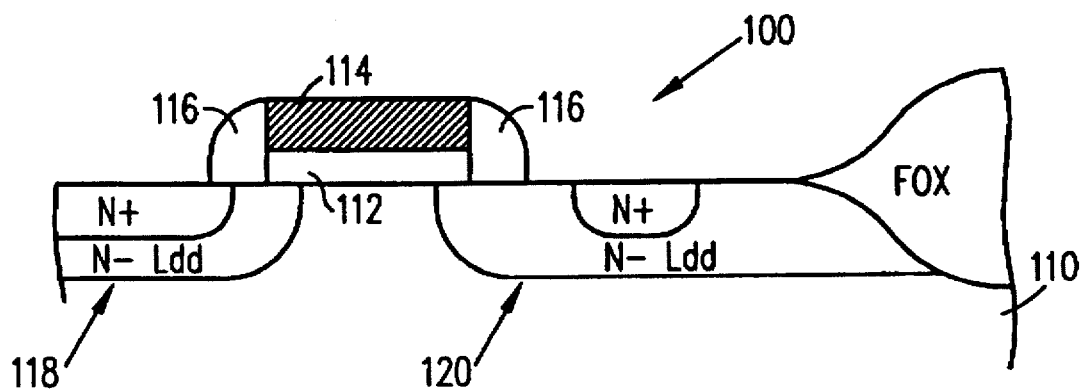
FIG. 2 is a cross-sectional diagram illustrating a high-voltage NMOS transistor 100 in accordance with the present invention.

FIG. 2 shows a cross-sectional diagram that illustrates a high-voltage NMOS transistor 100 in accordance with the present invention. As described in greater detail below, transistor 100 increases the breakdown voltage across the drain-to-substrate junction by utilizing a graded N+/N– drain region, and by reducing the width of the N+ drain region. By reducing the width of the N+ drain region, a substantially greater reverse-biased drain-to-substrate voltage is required to induce avalanche breakdown.

As shown in FIG. 2, transistor 100 includes a layer of gate oxide 112, which is formed over a portion of a lightly-doped P-type semiconductor substrate 110, and a gate 114, which is formed over the layer of gate oxide 112. Transistor 100 also includes a layer of spacer material 116 which is formed over substrate 110 and on the sidewalls of the gate 114 and the layer of gate oxide 112. In addition, a source region 118 and a drain region 120 are formed in substrate 110 on opposite sides of gate 114.

As further shown in FIG. 2, drain region 120 includes a lightly-doped N-type region N– which, in part, is formed under the layer of spacer material 116, and a heavily-doped N-type region N+ which is formed within the lightly-doped region N–. In accordance with the present invention, the heavily-doped region N+ is not partially formed under either the layer of spacer material 116 or an adjacent field oxide region FOX, as is conventionally the case but, instead, is formed in a region of substrate 110 which is uncovered by the layer of space material 116 and the field oxide region FOX.

Although transistor 100 is depicted as an NMOS transistor in FIG. 2, the present invention is equally applicable to PMOS transistors. FIGS. 3–7 show cross-sectional views that illustrate the steps for forming both a high-voltage NMOS transistor and a high-voltage PMOS transistor in accordance with the present invention.

The process of the present invention begins with the formation of a series of field oxide regions FOX. As shown in FIG. 3, the field oxide regions FOX are formed in a P-type semiconductor substrate 200 which includes an N-well 202 that has been formed in accordance with conventional CMOS processing steps. As is well known, the NMOS transistor will be formed in substrate 200 while the PMOS transistor will be formed in the N-well 202.

The field oxide regions FOX are first formed by growing a layer of pad oxide (not shown) approximately 200 Å thick over substrate 200 and N-well 202. Following this, a layer of nitride (not shown) approximately 2,000 Å thick is deposited over the layer of pad oxide.

Next, a field oxide mask is formed over the nitride/pad oxide composite and patterned to define the field oxide regions FOX. After this, the unmasked areas are etched until the underlying layer of nitride is removed. As a result of this etching step, a plurality of pad oxide regions are exposed.

After the unmasked layer of nitride has been removed, the field oxide mask is stripped, followed by the formation of a P-field implant mask. The unmasked regions of pad oxide regions are then implanted with $BF_2$ at 50 KeV to form implant regions 204 which have an implant concentration of approximately $4 \times 10^{13}/cm^2$. After the pad oxide regions have been implanted, the resulting device is oxidized to form the field oxide regions FOX. The fabrication steps utilized to form the field oxide regions FOX are conventional and well known in the art.

Once the field oxide regions FOX have been formed, the next step is to set the channel threshold voltages of the n-channel transistors. The formation of the N-well 202 sets the threshold voltages of the p-channel transistors.

The threshold voltages are first set by removing the nitride/pad oxide composite layer. Next, a layer of sacrificial oxide (not shown) is grown on the exposed semiconductor substrate 200 and the N-well 202. Following this, a threshold voltage mask is formed over the layer of sacrificial oxide and patterned to protect the N-well 202.

After the threshold voltage mask has been formed and patterned, the semiconductor substrate 200 underlying the unmasked areas of sacrificial oxide is implanted with $B_{11}$ at 40 KeV to form an implant concentration of approximately $5 \times 10^{12}/cm^2$. Following this, the threshold voltage mask is stripped and the layer of sacrificial oxide is removed. The fabrication steps utilized to set the channel threshold voltages are also conventional and well known in the art.

After the layer of sacrificial oxide has been removed, the next step is the initial formation of the gates of the transistors. As shown in FIG. 3, the gates are first formed by growing a layer of gate oxide 210 approximately 200 Å thick over substrate 200 and N-well 202. Next, a layer of polysilicon (poly2) 212 approximately 1,500 Å thick is deposited over the layer of gate oxide 210 and the field oxide regions FOX. The layer of poly2 212 is then doped in a conventional manner. Following this, a photoresist mask (not shown) is formed and patterned over the layer of poly2 212.

Referring to FIG. 4, after the mask has been formed, the unmasked layer of poly2 212 is plasma etched to form the gates 214. Once the gates 214 have been formed, the layer of spacer material is initially formed by depositing a layer of oxide 216 over the entire structure. After this, as shown in FIG. 5, the layer of oxide 216 is anisotropically etched to form spacers 218 which are formed on substrate 200 and on the sidewalls of the gates 214 and the layer of gate oxide 210.

Figure 6:
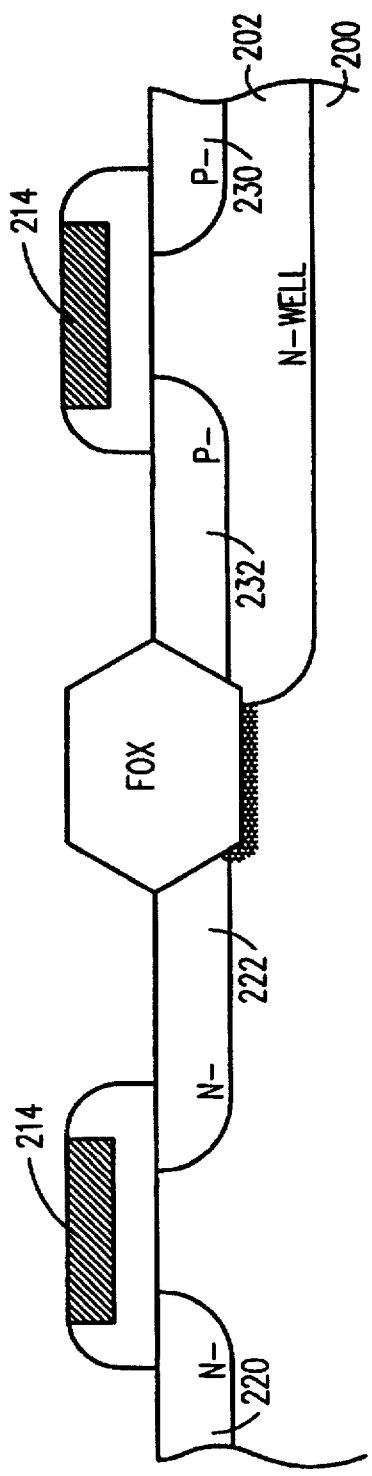

Referring to FIG. 6, the next step is the formation of the source and drain regions. The source and drain regions of the n-channel transistor are first formed by forming and patterning an n-channel implant mask (not shown). Once the mask has been formed, the unmasked regions of substrate 200 are implanted with phosphorous at 40 KeV to form a lightly-doped source region 220 and a lightly-doped drain region 222 with an implant concentration in the range of $2 \times 10^{13}/cm^2 - 8 \times 10^{13}/cm^2$.

Following this, the n-channel implant mask is stripped and a p-channel implant mask is formed and patterned to define the source and drain regions of the p-channel transistor. Once the mask has been formed, the unmasked regions of N-well 202 are implanted with $BF_2$ at 40 KeV to form a lightly-doped source region 230 and a lightly-doped drain region 232 with an implant concentration in the range of $5 \times 10^{12}/cm^2 - 1 \times 10^{13}/cm^2$.

Next, the p-channel implant mask is stripped and the resulting device is oxidized. As a result of this oxidation step, the source and drain boundaries are diffused outward to a point underlying the gates 214 and the field oxide regions FOX.

Figure 7:
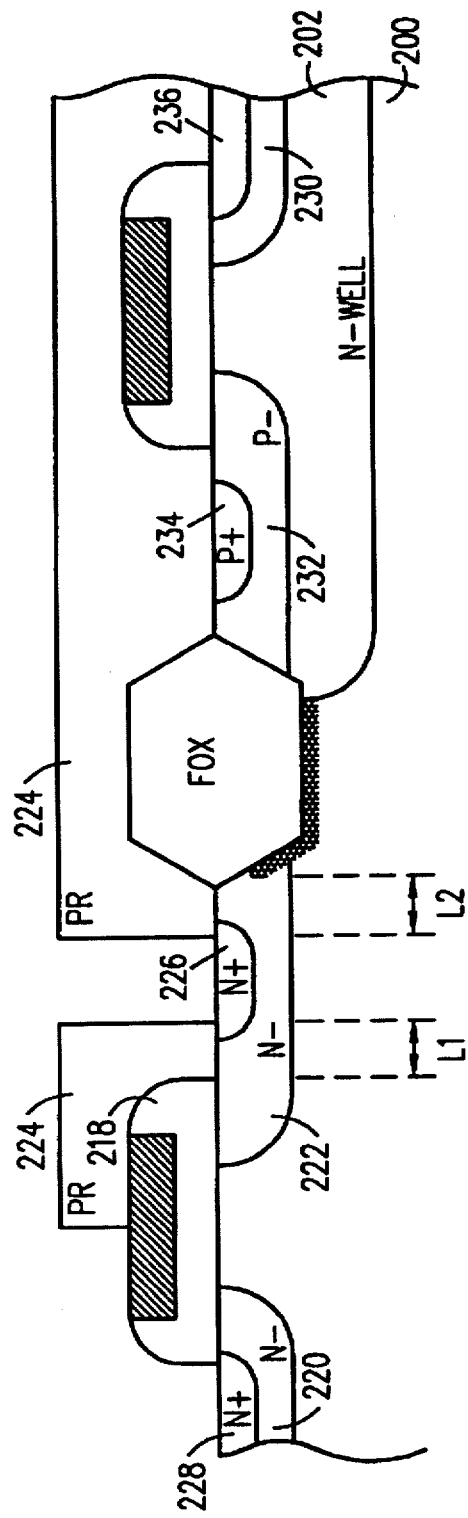

Referring to FIG. 7, an n-channel double-diffused mask 224 is then formed over the entire structure. In accordance with the present invention, the double diffused mask 224 is patterned to expose all of the source region 220, but only a portion of the drain region 222. Following this, the unmasked regions are implanted with arsenic at 40 KeV to form a heavily-doped drain region 226 and a heavily-doped source region 228 with an implant concentration in the range of $2 \times 10^{15}/cm^2 - 5 \times 10^{15}/cm^2$. As shown in FIG. 7, the heavily-doped drain region 226 forms a small arsenic well within the drain region 222 which is a distance L1 and a distance L2 from the outer edges of the spacer 218 and field oxide region FOX, respectively.

Following this, the n-channel double-diffused mask 224 is stripped, followed by the formation of a p-channel double-diffused mask (not shown). The p-channel double-diffused mask is patterned to expose all of the source region 230, but only a portion of the drain region 232. Next, the unmasked regions are implanted with $BF_2$ at 40 KeV to form a heavily-doped drain region 234 and a heavily-doped source region 236 with an implant concentration in the range of $8 \times 10^{14}/cm^2 - 4 \times 10^{15}/cm^2$. As shown in FIG. 7, the heavily-doped drain region 234 forms a small boron difluoride well within the drain region 232.

After the boron difluoride well has been formed, the p-channel double-diffused mask is stripped and the resulting device is again oxidized. As a result of this oxidation step, the boundaries of the heavily-doped source regions 228 and 236 are diffused outward to a point underlying the spacers 218. The boundaries of the heavily-doped drain regions 226 and 234, however, remain in an area of substrate 200 which is uncovered by the spacers 218 and the field oxide regions FOX due to the positioning provided by the double-diffused masks. Following this, the process continues with conventional steps.

Various alternatives to the method described above may also be employed in practicing the present invention. For example, although the above described process illustrated the formation of both a high-voltage n-channel transistor and a high-voltage p-channel transistor, low-voltage n-channel and p-channel transistors can also be formed during the same process.

FIG. 8 shows a cross-sectional diagram that illustrates the formation of a high-voltage n-channel transistor next to a low-voltage n-channel transistor. As shown in FIG. 8, a low-voltage n-channel transistor can be formed next to a high-voltage n-channel transistor by completely exposing the source and drain regions of the low-voltage transistor during the arsenic implant which forms the arsenic well 226. As a result, high-voltage transistors can be formed in accordance with the present invention without adding any additional masking steps.

As stated above, the principle advantage provided by the present invention is the increase in the breakdown voltage of a high-voltage MOS transistor. FIGS. 9A and 89 graphically depict the increased breakdown voltage which can be achieved with the present invention. As shown in FIGS. 9A and 9B, by increasing the length of lines L1 and L2, the breakdown voltages of a high-voltage transistor can be significantly increased.

It should be understood that various alternatives to the embodiment of the invention described herein may be employed in practicing the present invention. It is intended that the following claims define the scope of the invention and that methods and structures within the scope of these claims and their equivalents be covered thereby.

What is claimed is:

1. A method for forming a high-voltage transistor in a semiconductor substrate of a first conductivity type, the method comprising the steps of:

forming spaced-apart source and drain field oxide regions in the semiconductor substrate;

forming a layer of insulating material over the substrate;

depositing a layer of conductive material over the layer of insulating material;

forming a gate by removing selected portions of the layer of conductive material and the layer of insulating material, thereby exposing a first portion of the substrate;

depositing a layer of spacer material over the gate and the first portion of the substrate;

anisotropically etching the layer of spacer material to form a source spacer on a first sidewall of the gate and a drain spacer on a second sidewall of the gate, thereby exposing a second portion of the substrate;

implanting the second portion of the substrate with a first material having a second conductivity to form a lightly-doped drain region and a lightly-doped source region, the lightly-doped source region adjoining the source spacer and the source field oxide region, the lightly-doped drain region adjoining the drain spacer and the drain field oxide region;

forming a mask having a masked area and an unmasked area, the unmasked area being spaced apart from the drain spacer and the drain field oxide region;

implanting the unmasked area with a second material having the second conductivity type to form a heavily-doped drain region within the lightly-doped drain region, the heavily-doped drain region being spaced apart from the drain spacer and the drain field oxide; and removing the second mask.

2. The method of claim 1 wherein the first conductivity type is P-type and the second conductivity type is N-type.

3. The method of claim 2 wherein the layer of spacer material includes a deposited oxide.

4. The method of claim 3 wherein the layer of insulating material includes gate oxide.

5. The method of claim 1 wherein the first conductivity type is N-type and the second conductivity type is P-type.

6. The method of claim 5 wherein the layer of spacer material includes a deposited oxide.

7. The method of claim 6 wherein the layer of insulating material includes gate oxide.

8. The method of claim 1 wherein the lightly-doped drain region includes an implant concentration in the range of $2 \times 10^{13}/cm^2 - 8 \times 10^{13}/cm^2$.

9. The method of claim 1 wherein the heavily-doped drain region includes an implant concentration in the range of $2 \times 10^{15}/cm^2 - 5 \times 10^{15}/cm^2$.

10. The method of claim 1 wherein a side of the unmasked area is less than a distance from the drain spacer to the drain field oxide region.

* * * * *